United States Patent
Uchida

(10) Patent No.: US 10,018,923 B2
(45) Date of Patent: Jul. 10, 2018

(54) LITHOGRAPHY APPARATUS, AND METHOD OF MANUFACTURING ARTICLE

(71) Applicant: CANON KABUSHIKI KAISHA, Tokyo (JP)

(72) Inventor: Shinji Uchida, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/425,453

(22) Filed: Feb. 6, 2017

(65) Prior Publication Data

US 2017/0235229 A1    Aug. 17, 2017

(30) Foreign Application Priority Data

Feb. 17, 2016 (JP) .................................. 2016-028298

(51) Int. Cl.
  *G03B 27/58* (2006.01)
  *G03F 7/20* (2006.01)
  *G03F 7/00* (2006.01)

(52) U.S. Cl.
  CPC ............ *G03F 7/707* (2013.01); *G03F 7/0002* (2013.01)

(58) Field of Classification Search
  CPC ............................. G03F 7/707; G03F 7/70002
  USPC ..................................... 355/53, 72
  See application file for complete search history.

(56) References Cited

U.S. PATENT DOCUMENTS

| 7,630,056 | B2 | 12/2009 | Nishikawara |
| 9,694,535 | B2 * | 7/2017 | Mori .................. B29C 59/002 |
| 2008/0106707 | A1 * | 5/2008 | Kobayashi ........ G03F 7/70341 355/30 |
| 2013/0003249 | A1 * | 1/2013 | Lee .................. H01L 21/6833 361/234 |
| 2015/0042012 | A1 | 2/2015 | Nakagawa et al. |
| 2015/0174816 | A1 * | 6/2015 | Mizuno ............... B29C 59/026 264/101 |

FOREIGN PATENT DOCUMENTS

| JP | 4961299 B2 | 6/2012 |
| JP | 2013175631 A | 9/2013 |

* cited by examiner

*Primary Examiner* — Hung Henry Nguyen
(74) *Attorney, Agent, or Firm* — Rossi, Kimms & McDowell LLP

(57) ABSTRACT

The present invention provides a lithography apparatus that performs patterning on a substrate using an original, the apparatus including a supply device configured to supply a gas to a space between the substrate and the original, a chuck configured to hold the substrate, a movable device that holds the chuck and is movable, and a plate provided on the movable device and surrounding the chuck, wherein the chuck includes a first edge, on a side of the chuck facing the original, protruding toward the plate.

10 Claims, 4 Drawing Sheets

LITHOGRAPHY APPARATUS, AND METHOD OF MANUFACTURING ARTICLE

BACKGROUND OF THE INVENTION

Field of the Invention

The present invention relates to a lithography apparatus, and a method of manufacturing an article.

Description of the Related Art

There is known an imprint apparatus as a lithography apparatus used for manufacturing semiconductor devices. The imprint apparatus is required to improve the filling property of the imprint material to a pattern formed on a mold from the viewpoints of productivity and accuracy of patterns formed on the substrate. Thus, in Japanese Patent Laid-Open No. 2013-175631, there is proposed a technique of performing an imprint process in a state in which the air in a space between the mold and the substrate (imprint material) is substituted with a gas such as helium or pentafluoropropane.

Furthermore, as disclosed in Japanese Patent No. 4961299, a protection plate (also called a flush plate) is arranged on a substrate holding unit (substrate stage) so that the upper surface of the substrate and the upper surface of the flush plate are flush and so as to surround the periphery of the substrate. The arrangement of such a protection plate in the imprint apparatus allows a mold to maintain a state facing the substrate or the protection plate even if the substrate is moved within the plane to perform an imprint process in each imprint region of the substrate. Hence, it is advantageous in maintaining a constant concentration of a gas in the space between the mold and the substrate.

However, if a gas is supplied to the substrate and the protection plate from a gas supply unit arranged in the upper side of the substrate holding unit, the gas flows to a space below a chuck via a gap between the protection plate and the chuck that holds the substrate. Therefore, it becomes difficult to maintain a constant concentration of a gas in the space between the mold and the substrate without changing the flow rate of the gas supplied from the gas supply unit. Note that the space is provided below the chuck to insert a robot hand for replacing (collecting) the chuck.

SUMMARY OF THE INVENTION

The present invention provides, for example, a lithography apparatus advantageous in adjusting of concentration of a gas in a space between an original and a substrate.

According to one aspect of the present invention, there is provided a lithography apparatus that performs patterning on a substrate using an original, the apparatus including a supply device configured to supply a gas to a space between the substrate and the original, a chuck configured to hold the substrate, a movable device that holds the chuck and is movable, and a plate provided on the movable device and surrounding the chuck, wherein the chuck includes a first edge, on a side of the chuck facing the original, protruding toward the plate.

Further aspects of the present invention will become apparent from the following description of exemplary embodiments with reference to the attached drawings.

DESCRIPTION OF THE EMBODIMENTS

Figure 1:
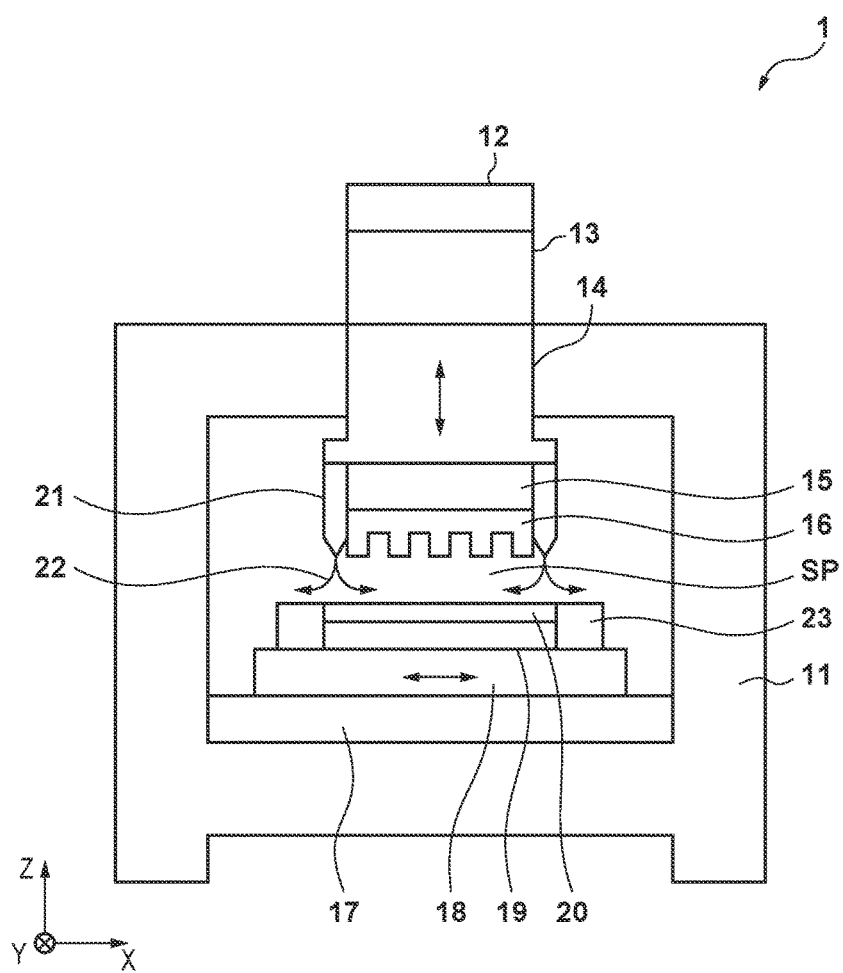
FIG. 1 is a schematic view showing the arrangement of an imprint apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an imprint apparatus 1 as an aspect of the present invention. The imprint apparatus 1 is a lithography apparatus that forms a pattern on a substrate by using an original. In this embodiment, the imprint apparatus 1 is implemented as an apparatus that performs an imprint process of molding an imprint material on a substrate by using a mold and forming a pattern on the substrate.

This embodiment assumes a photo-curing resin material as an imprint material and adopts a photo-curing method of curing the imprint material by irradiation with light (such as ultraviolet light). However, the present invention does not limit the imprint material to a resin material, and the material may be, for example, a photo-curing material including an inorganic powder or particles. Also, the curing method of the imprint material is not limited to a photo-curing method. For example, a heat-curing method of curing an imprint material by application of heat may be adopted.

The imprint apparatus includes, as shown in FIG. 1, a main body structure 11, a light source 12, an illumination optical system 13, a mold driving unit 14, a mold chuck 15, a stage platen 17, a substrate stage 18, a substrate chuck 19, a gas supply unit 21, and a protection plate 23. The entire imprint apparatus 1 is housed in a chamber (not shown), and a constant atmosphere is maintained inside the chamber. Additionally, in the following description, a direction along the optical axis of the illumination optical system 13 which irradiates the imprint material on the substrate with light is set as the Z-axis, and directions orthogonal to each other in a plane perpendicular to the Z-axis are set as the X-axis and the Y-axis.

The main body structure 11 has a highly rigid structure. The light source 12, an illumination optical system 13, the mold driving unit 14, and the stage platen 17 are installed in the main body structure 11. The light source 12 includes a halogen lamp that generates ultraviolet light. The illumination optical system 13 which includes a lens, an aperture, and a shutter irradiates the imprint material supplied on substrate with light to cure the imprint material.

The mold driving unit 14 holds a mold 16 via the mold chuck 15 and can be driven in the Z, ωX, and ωY directions. Sensors (not shown) which measure the positions of the mold driving unit 14 in the Z, ωX, and ωY directions are provided in the imprint apparatus 1. The position of mold driving unit 14 is controlled based on the measurement results of the sensors.

The mold 16 is an original which includes a three-dimensional pattern on the surface that faces a substrate 20 and is formed from a light passing material to cure the imprint material on the substrate. The mold 16 is loaded from outside the imprint apparatus 1 by a mold conveying system and is held by the mold chuck 15.

The substrate stage 18 is placed (mounted) on the stage platen 17. The substrate stage 18 holds the substrate chuck 19 that chucks and holds the substrate 20 and can be driven in the X, Y, and θz directions. In this embodiment, the substrate stage 18 is a movable device movable while holding (chucking) the substrate chuck 19. Sensors (not shown) which measure the positions of the substrate stage 18 in the X, Y, and θz directions are provided in the imprint apparatus 1. The position of substrate stage 18 is controlled based on the measurement results of the sensors.

The substrate 20 is a substrate to which the pattern of the mold 16 is transferred and includes, for example, a single crystal silicon substrate or an SOI (Silicon on Insulator) substrate. The imprint material is supplied (applied) on the substrate 20 from a supply unit including a dispenser. The substrate 20 is loaded from outside the imprint apparatus 1 by a substrate conveying system and is held by the substrate chuck 19.

The gas supply unit 21 is arranged around the mold 16, supplies a gas 22 to an imprint space SP between the mold 16 and the substrate 20 (protection plate 23), and substitutes (fills) the air in the imprint space SP with the gas 22. The gas 22 includes a permeable gas having a dissolving or diffusing property with respect to at least one of the mold 16, the substrate 20, and the imprint material or a condensable gas having a property of being condensed and liquefied by pressure application when molding the imprint material. The gas 22 includes, for example, helium or pentafluoropropane. By substituting the air in the imprint space SP with the gas 22, the filling property of the imprint material to the pattern of the mold 16 when molding the imprint material on the substrate by the mold 16 can be improved.

The protection plate 23 is provided on the substrate stage 18 and surrounds the substrate chuck 19. The protection plate 23 is formed so that its surface (the surface on the side of the original) is almost flush with the surface of the substrate 20 held by the substrate chuck 19. When an imprint process is performed on a shot region (partial field) which includes an edge portion of the substrate 20, the gas 22 is supplied in a state in which the gas supply unit 21 faces the substrate 20 and the protection plate 23. Since the volume change of the imprint space SP where the gas 22 is to be supplied can be minimized by arranging the protection plate 23, the change in the concentration of the gas in the imprint space can be suppressed. Hence, the filling property of the imprint material to the pattern of the mold 16 can be ensured.

In addition, in the imprint apparatus 1, a sensor (not shown) which measures the Z-direction position of the substrate 20 held by the substrate chuck 19 is installed in the main body structure 11. Furthermore, a sensor (not shown) which measures the Z-direction position of the mold 16 held by the mold chuck 15 is installed in the substrate stage 18.

Figure 2A:
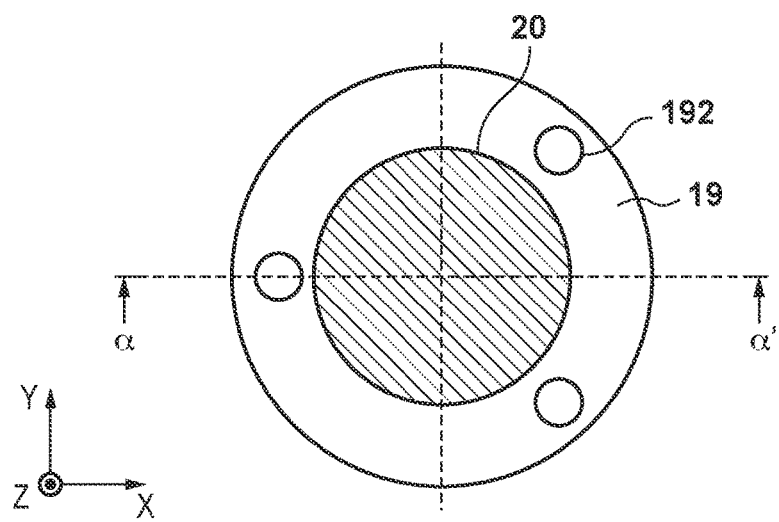
FIGS. 2A and 2B are views showing the arrangements of a substrate chuck and a protection plate in the imprint apparatus shown in FIG. 1.
Figure 2B:
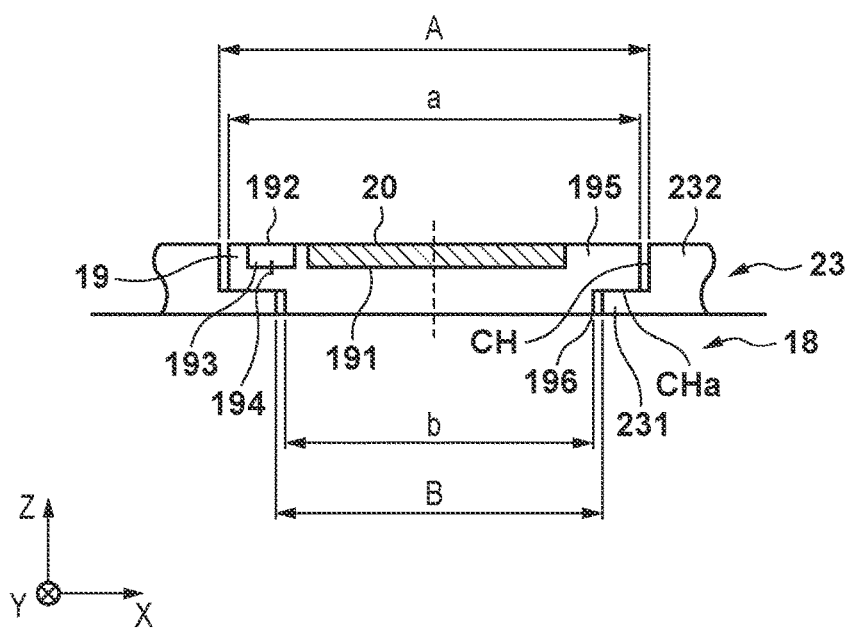

FIG. 2A is a top view of the substrate chuck 19. FIG. 2B shows a cross section of the substrate chuck 19 taken in a direction (Z direction) perpendicular to the surface of the substrate 20, that is, a cross-sectional view of the substrate chuck 19 taken along α-α shown in FIG. 2A. As described above, the substrate chuck 19 is placed on the substrate stage 18 and is, for example, held by the substrate stage 18 by being chucked by a vacuum pressure. The protection plate 23 is arranged outside the substrate chuck 19.

The substrate chuck 19 is formed from ceramics such as silicon carbide or alumina. As shown in FIG. 2B, a concave portion (recess) 191 for placing (holding) the substrate 20 is formed on the surface on the side of the mold 16 of the substrate chuck 19. For example, the substrate chuck 19 chucks and holds the substrate 20 placed in the concave portion 191 by a vacuum pressure. Concave portions (recesses) 193 for placing magnetic members 192 are also formed on the surface on the side of the mold 16 of the substrate chuck 19. In this embodiment, the concave portions 193 are formed at three locations at equal angles on the peripheral portion of the surface on the side of the mold 16 of the substrate chuck 19. The magnetic member 192 is placed in each of the concave portions 193, and the magnetic member 192 is fastened to the concave portion 193 (substrate chuck 19) via a corresponding fastening member 194 such as a bolt. In a state in which the substrate 20 is placed on the concave portion 191, the surface of the substrate 20, the surface on the side of the mold 16 of the substrate chuck 19, the surface on the side of the mold 16 of the magnetic member 192 placed in each concave portion 193, and the surface of the protection plate 23 are flush (form a single plane).

The substrate chuck 19 also includes, as shown in FIG. 2B, a first edge portion 195 protruding toward the protection plate 23 in the portion on the side of the mold 16. In FIG. 2B, a portion including the first edge portion of the substrate chuck 19 and the first edge portion 195 are formed from a single member. The first edge portion 195 functions as the protection plate 23. On the other hand, the protection plate 23 includes a second edge portion 231 protruding toward the substrate chuck 19 in its portion on the side of the substrate stage 18. In this embodiment, the substrate chuck 19 is held by the substrate stage 18 so that the first edge portion 195 and the second edge portion 231 face each other in a direction perpendicular to the surface on which the substrate chuck 19 holds the substrate 20. Note that there is a very small gap between the first edge portion 195 and the second edge portion 231 in the Z direction.

The outer diameter (external diameter) of the side surface of the substrate chuck 19 differs between its upper portion (on the side of the mold 16) and lower portion (on the side of the substrate stage 18) in a cross section taken in a direction perpendicular to the holding surface in which the substrate chuck 19 holds the substrate 20. More specifically, the substrate chuck 19 is designed so that a dimension a of the outer diameter of the first edge portion 195 is larger than a dimension b of the outer diameter of a portion 196 on the side of the substrate stage 18 (a>b). The inner diameter of the side surface of the protection plate 23 differs between its upper portion and lower portion in a cross section taken in a direction perpendicular to the holding surface on which the substrate chuck 19 holds the substrate 20. More specifically, the protection plate 23 is designed so that a dimension A of the inner diameter of a portion 232 on the side of the mold 16 is larger than a dimension B of the inner diameter of the second edge portion 231 (A>B). Furthermore, the substrate chuck 19 and the protection plate 23 are designed so that the dimension a of the outer diameter of the first edge portion 195 is larger than the dimension B of the inner diameter of the second edge portion 231 (a>B) in a cross section taken in a direction perpendicular to the holding surface on which the substrate chuck 19 holds the substrate 20.

A channel (flow path) CH for the gas 22 supplied from the gas supply unit 21 to the imprint space SP is formed between the substrate chuck 19 and the protection plate 23 by such an arrangement. The conductance of a portion, of the channel CH, where the first edge portion 195 and the second edge portion 231 face each other is smaller than the conductance of the remaining portion. More specifically, a bent portion CHa which decreases the conductance of one portion of the channel CH compared to the other portion of the channel CH is formed on the one portion of the channel CH by the first edge portion 195 and the second edge portion 231, thereby preventing the channel CH from becoming straight. As a result, when the gas 22 supplied to the imprint space SP flows out, that is, leaks to a space (not shown) below the substrate chuck 19 via the channel CH, the leak amount can be suppressed.

Additionally, in this embodiment, the substrate chuck 19 is designed so that the dimension b of the outer diameter of the portion 196 is larger than the outer diameter of a region of the holding surface for holding the substrate 20 in a cross section taken in a direction perpendicular to the holding surface on which the substrate chuck 19 holds the substrate 20. Note that the region of the holding surface for holding the substrate 20 corresponds to the inner diameter of the concave portion 191 in FIG. 2B. Hence, it is possible to suppress the reduction in the flatness of the substrate 20 held by the substrate chuck 19.

Figure 3:
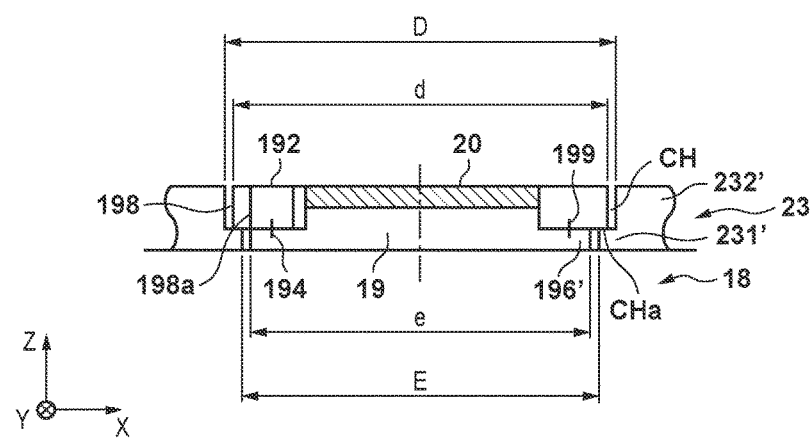
FIG. 3 is a view showing another arrangement of the substrate chuck and the protection plate in the imprint apparatus shown in FIG. 1.

Another example of the arrangement of the substrate chuck 19 will be described with reference to FIG. 3. FIG. 3 is a cross-sectional view of the substrate chuck 19 shown in FIG. 2A taken along a line α-α'. In FIG. 3, the first edge portion 195 and a portion excluding the first edge portion 195 of the substrate chuck 19 are formed from separate members, and the first edge portion 195 is implemented as a ring plate 198. The ring plate 198 is arranged outside a placement surface for placing the substrate 20, that is, it is arranged so as to surround the placement surface and fastened to the substrate chuck 19 via a fastening member 199 such as a bolt. The ring plate 198 functions as the protection plate 23. The substrate chuck 19 is held by the substrate stage 18 so that the ring plate 198 and a second edge portion 231' overlap. Note that there is a very small gap between the ring plate 198 and the second edge portion 231' in the Z direction.

Concave portions (recesses) 198a for placing the magnetic members 192 are formed in the surface on the side of the mold 16 of the ring plate 198. The concave portions 198a are formed in three locations at equal angles on the ring plate 198. The magnetic member 192 is placed in each of the concave portions 198a, and the magnetic member 192 is fastened to the substrate chuck 19 via the fastening member 194 such as a bolt. In a state in which the substrate 20 is placed on the placement surface, the surface of the substrate 20, the surface on the side of the mold 16 of the ring plate 198, the surface on the side of the mold 16 of the magnetic member 192 placed in each concave portion 198a, and the surface of the protection plate 23 are flush (form a single plane).

The outer diameter of the side surface of the substrate chuck 19 differs between its upper portion and lower portion in a cross section taken in a direction perpendicular to the holding surface on which the substrate chuck 19 holds the substrate 20. More specifically, the substrate chuck 19 is designed so that a dimension d of the outer diameter of the ring plate 198 is larger than a dimension e of the outer diameter of a portion 196' on the side of the substrate stage 18 (d>e). The inner diameter of the side surface of the protection plate 23 differs between its upper portion and lower portion in a cross section taken in a direction perpendicular to the holding surface on which the substrate chuck 19 holds the substrate 20. More specifically, the protection plate 23 is designed so that a dimension D of the inner diameter of a portion 232' on the side of the mold 16 is larger than a dimension E of the inner diameter of the second edge portion 231' (D>E). Furthermore, the substrate chuck 19 and the protection plate 23 are designed so that the dimension d of the outer diameter of the ring plate 198 is larger than the dimension E of the inner diameter of the second edge portion 231' (d>E) in a cross section taken in a direction perpendicular to the holding surface on which the substrate chuck 19 holds the substrate 20.

Since this kind of arrangement eliminates the need to form the concave portion 191 for the placement of the substrate 20 on the substrate chuck 19, it is comparatively easy to form a placement surface for placing the substrate 20 on the substrate chuck 19. Note that the substrate chuck 19, the magnetic members 192, and the ring plate 198 may be formed by a single member made from a ferromagnetic material.

Figure 4:
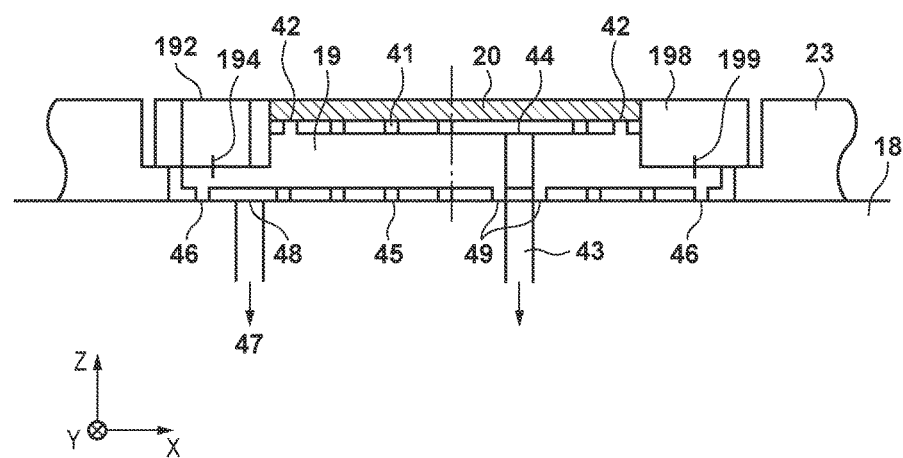
FIG. 4 is a view showing the arrangement of the substrate chuck and the protection plate in the imprint apparatus shown in FIG. 1.

Here, an arrangement for the substrate stage 18 to chuck the substrate chuck 19 and an arrangement for the substrate chuck 19 to chuck the substrate 20 will be described with reference to FIG. 4. Although a description will be made using the example of the arrangement of the substrate chuck 19 shown in FIG. 3, the same also applies to the arrangement of the substrate chuck 19 shown in FIG. 2B. A plurality of support pins 41 for supporting the substrate 20 and a sealing bank 42 that surrounds the plurality of support pins 41 are arranged on the surface on the side of the mold 16 of the substrate chuck 19. Also, an exhaust hole 44 connected to an exhaust line 43 is formed on the surface on the side of the mold 16 of the substrate chuck 19. In a state in which the substrate 20 is supported by the plurality of support pins 41 and the sealing bank 42, the substrate chuck 19 can chuck the substrate 20 by exhausting air from a sealing space between the substrate 20 and the surface on the side of the mold 16 of the substrate chuck 19 via the exhaust line 43.

A plurality of support pins 45 and a sealing bank 46 that surrounds the plurality of support pins 45 are arranged on the surface on the side of the substrate stage 18 of the substrate chuck 19. The substrate stage 18 supports the substrate chuck 19 via the plurality of support pins 45 and the sealing bank 46. On the other hand, an exhaust hole 48 connected to an exhaust line 47 is formed on the substrate stage 18. Note that a sealing bank 49 is arranged around the exhaust line 43. In a state in which the substrate chuck 19 is supported by the plurality of support pins 45 and the sealing banks 46 and 49, air is exhausted from a sealed space between the substrate stage 18 and the surface on the side of the substrate stage 18 of the substrate chuck 19 via the exhaust line 47. This allows the substrate stage 18 to chuck the substrate chuck 19. Accordingly, the substrate chuck 19 is released from the substrate stage 18 when the chucking by the substrate stage 18 is stopped.

Figure 5:
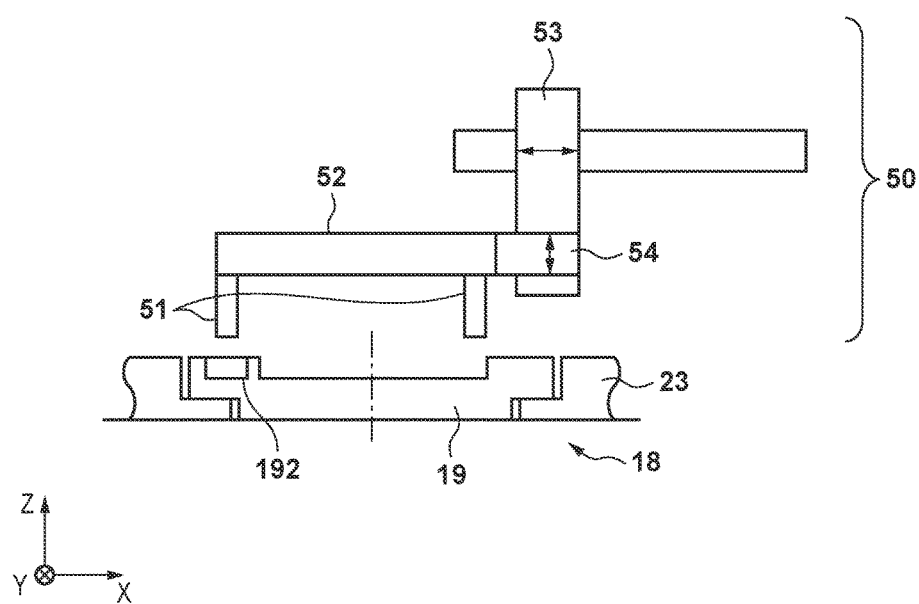
FIG. 5 is a view showing the arrangement of a conveying unit in the imprint apparatus shown in FIG. 1.

As shown in FIG. 5, the imprint apparatus 1 includes a conveying unit 50 that holds the surface on the side of the mold 16 of the substrate chuck 19 and conveys the substrate chuck 19 to, for example, replace the substrate chuck 19. The conveying unit 50 includes a movable plate 52 movable in the X and Z directions, an X driving unit 53, and a Z driving unit 54. The movable plate 52 is driven in the X and Y directions by the X driving unit 53 and the Z driving unit 54, respectively. Electromagnets 51 serving as holding units that generate holding power with respect to the surface on the side of the mold 16 of the substrate chuck 19 are arranged in the movable plate 52. In this embodiment, three electromagnets 51 are arranged so as to simultaneously face the magnetic members 192 placed in the concave portions 193 of the substrate chuck 19, respectively. Each electromagnet 51 generates electromagnetic power between itself and the magnetic member 192. As a result, the conveying unit 50 can hold the substrate chuck 19 by a magnetic force via the magnetic member 192.

A procedure of conveying the substrate chuck 19 from the substrate stage 18 will be described. First, the movable plate 52 which has been retreated during the imprint process is moved in the X direction, and the movable plate 52 is positioned so that the electromagnets 51 will face the magnetic members 192. Next, the movable plate 52 is lowered in the Z direction, and the electromagnets 51 and the magnetic members 192 are brought into contact with each other. Electromagnetic power is generated between each electromagnet 51 and the corresponding magnetic member 192 by supplying a current to the electromagnet 51. When the electromagnets 51 and the magnetic members 192 chuck each other (that is, when the substrate chuck 19 is held), chucking of the substrate chuck 19 by the substrate stage 18 is stopped. Subsequently, the movable plate 52 is moved upward in the X direction, the substrate chuck 19 is lifted from the substrate stage 18, and the movable plate 52 is moved in the X direction to convey the substrate chuck 19 to outside of the imprint apparatus 1.

In this manner, the conveying unit 50 approaches the substrate chuck 19 from above and generates power to hold the substrate chuck 19 from above. This kind of arrangement eliminates the need to provide a space below the substrate chuck 19 to insert a robot hand to convey the substrate chuck 19. As a result, when the gas 22 supplied to the imprint space SP flows out, that is, leaks to the space (not shown) below the substrate chuck 19, the leak amount can be suppressed.

In this manner, according to the imprint apparatus 1 of this embodiment, the leak amount of the gas 22 supplied to the imprint space to the space below the substrate chuck 19 can be suppressed. Therefore, the imprint apparatus 1 can maintain a constant gas concentration in the imprint space without changing the flow rate of the gas 22 supplied from the gas supply unit 21.

Note that it is preferable to minimize the gap (channel CH) between the substrate chuck 19 and the protection plate 23 as much as possible to minimize the leak amount of the gas 22 supplied to the imprint space SP. In the same manner, it is preferable to minimize the gap between the magnetic members 192 and the concave portions 193 or the ring plate 198 as much as possible.

The substrate chuck 19 and the ring plate 198 (substrate 20) are described as having a circular shape in this embodiment. However, the present invention is not limited to this, and their shapes may appropriately be changed in accordance with the shape of the substrate 20. For example, the shape of the substrate chuck 19 and the ring plate 198 may be a polygon.

A method of manufacturing an article according to an embodiment of the present invention is, for example, suitable for manufacturing an article such as a semiconductor device or liquid crystal display element. The manufacturing method includes a step of forming a pattern on a substrate (a wafer, a glass plate, a film-like substrate, or the like) using the imprint apparatus 1 and a step of processing the substrate on which the pattern has been formed. The step of processing the substrate can include a step of removing a residual layer of the pattern. Additionally, other known steps such as a step of etching the substrate by using the pattern as a mask can be included. The method of manufacturing an article according to the embodiment is superior to a conventional method in at least one of the performance, quality, productivity, and production cost of the article.

The present invention does not limit the lithography apparatus to the imprint apparatus and is also applicable to the lithography apparatuses such as an exposure apparatus. Note that the exposure apparatus is a lithography apparatus that uses beams such as light and charged particles to expose the substrate via a reticle or a mask and a projection optical system. In this case, the space between the substrate and the mask serving as the original includes the space between the substrate and the final surface on the side of the substrate of the projection optical system.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-028298 filed on Feb. 17, 2016, which is hereby incorporated by reference herein in its entirety.

What is claimed is:

1. A lithography apparatus that performs patterning on a substrate using an original, the lithography apparatus comprising:
   a supply device configured to supply a gas to a space between the substrate and the original;
   a chuck configured to hold the substrate and having a first side that faces the original and a second side opposite the first side;
   a movable device that holds the chuck and is movable; and
   a plate provided on the movable device and surrounding the chuck,
   wherein the chuck includes an edge portion having a first edge on the first side and a second edge on the second side, and
   wherein the first edge is disposed protruding farther outwardly toward the plate than the second edge.

2. The apparatus according to claim 1, wherein:
   the plate includes a third edge, on a side of the plate facing the movable device, protruding toward the chuck, and
   the chuck is held by the movable device, with the first second edge and the third edge facing each other.

3. The apparatus according to claim 2, wherein:
   a gas flow path is provided between the chuck and the plate,
   a gas flow through the gas flow path, between the second edge and the third edge facing each other, is smaller than a remaining portion of the gas flow path.

4. The apparatus according to claim 1, wherein an outer diameter of the chuck, along the first edge is larger than an outer diameter of the chuck, along the second edge.

5. The apparatus according to claim 1, wherein the first edge and a portion including the first edge are formed from a single member.

6. The apparatus according to claim 1, wherein the first edge and a portion, excluding the first edge, of the chuck are fastened by a fastening member.

7. The apparatus according to claim 1, further comprising a conveying device configured to hold a side, facing the original, of the chuck, and convey the held chuck.

8. The apparatus according to claim 7, wherein:
   the chuck includes a magnetic material member on the side, facing the original, of the chuck, and
   the conveying device is configured to hold the chuck via the magnetic material member by a magnetic force.

9. The apparatus according to claim 1, wherein the patterning is performed by molding an imprint material on the substrate with the original.

10. A method of manufacturing an article, the method comprising steps of:
- performing patterning on a substrate using a lithography apparatus; and
- processing the substrate, on which the patterning has been performed, to manufacture the article,
- wherein the lithography apparatus performs the patterning on the substrate using an original, and includes:
- a supply device configured to supply a gas to a space between the substrate and the original;
- a chuck configured to hold the substrate and having a first side that faces the original and a second side opposite the first side;
- a movable device that holds the chuck and is movable; and
- a plate provided on the movable device and surrounding the chuck,
- wherein the chuck includes an edge portion having a first edge on the first side and a second edge on the second side, and
- wherein the first edge is disposed protruding farther outwardly toward the plate than the second edge.

* * * * *